US010050234B2

(12) United States Patent
Kim et al.

(10) Patent No.: US 10,050,234 B2
(45) Date of Patent: Aug. 14, 2018

(54) OPTICAL FILM FOR REDUCING COLOR SHIFT AND ORGANIC LIGHT-EMITTING DISPLAY DEVICE EMPLOYING THE SAME

(71) Applicants: Samsung Electronics Co., Ltd., Suwon-si, Gyeonggi-do (KR); Samsung Corning Precision Materials Co., Ltd., Gumi-si, Gyeongsangbuk-do (KR); CHEIL INDUSTRIES INC., Gumi-si, Gyeongsangbuk-do (KR)

(72) Inventors: Hyunmin Kim, Uiwang-si (KR); Youmin Shin, Gyeongsangbuk-do (KR); Hongshik Shim, Seoul (KR); Young Oh, Uiwang-si (KR); Chulho Jeong, Hwaseong-si (KR); Eunyoung Cho, Gyeongsangbuk-do (KR)

(73) Assignees: SAMSUNG ELECTRONICS CO., LTD, Gyeonggi-Do (KR); CORNING PRECISION MATERIALS CO., LTD., Chungcheongnam-Do (KR); CHEIL INDUSTRIES INC., Gyeongsangbuk-Do (KR)

( * ) Notice: Subject to any disclaimer, the term of this patent is extended or adjusted under 35 U.S.C. 154(b) by 164 days.

(21) Appl. No.: 14/510,483

(22) Filed: Oct. 9, 2014

(65) Prior Publication Data

US 2015/0102327 A1 Apr. 16, 2015

(30) Foreign Application Priority Data

Oct. 15, 2013 (KR) ........................ 10-2013-0122817

(51) Int. Cl.

| | |
|---|---|
| ***H01L 51/52*** | (2006.01) |
| ***G02B 1/11*** | (2015.01) |
| *H01L 27/32* | (2006.01) |

(52) U.S. Cl.

CPC ............ *H01L 51/5275* (2013.01); *G02B 1/11* (2013.01); *H01L 51/5281* (2013.01); (Continued)

(58) Field of Classification Search

CPC ............. H01L 27/3232; H01L 51/5275; H01L 51/5281; H01L 51/5284

See application file for complete search history.

(56) References Cited

U.S. PATENT DOCUMENTS

| | | | | |
|---|---|---|---|---|
| 2002/0167725 A1* | 11/2002 | Goto | G03B 21/625 | 359/456 |
| 2007/0046161 A1* | 3/2007 | Haenichen | H01L 51/5275 | 313/112 |

(Continued)

FOREIGN PATENT DOCUMENTS

| | | |
|---|---|---|
| JP | 2004191611 B2 | 7/2004 |
| JP | 2007003983 A | 1/2007 |

(Continued)

OTHER PUBLICATIONS

English machine translation of WO2010/113737A1.*

(Continued)

*Primary Examiner* — Marcos D Pizarro
*Assistant Examiner* — Christopher M Roland
(74) *Attorney, Agent, or Firm* — Cantor Colburn LLP

(57) ABSTRACT

An optical film includes a high refractive index pattern layer including a material having a refractive index greater than about 1, wherein a groove pattern defined by grooves, each of which has a curved groove surface and a depth greater than a width, is defined on a first surface of the high refractive index pattern, the grooves are two-dimensionally arranged in a first direction and a second direction, and a cross-sectional shape of each of the grooves has an anisotropic shape, in which a length in a first axial direction and (Continued)

1
120 121 122
110
2a 2b
GR
c
DR2
DR1 a length in a second axial direction, which is perpendicular to the first axial direction, are different from each other, and a low refractive index pattern layer including a material having a refractive less than the refractive index of the high refractive index pattern layer and further including fillers corresponding to the grooves.

19 Claims, 14 Drawing Sheets

(52) U.S. Cl.
CPC ...... *H01L 51/5284* (2013.01); *H01L 27/3232* (2013.01); *H01L 51/5265* (2013.01)

(56) References Cited

U.S. PATENT DOCUMENTS

2007/0069635 A1* 3/2007 Cok ...................... H01L 27/322 313/504
2007/0153377 A1* 7/2007 Goto ...................... G02B 5/045 359/460
2008/0036945 A1* 2/2008 Chen .................... G02B 5/3083 349/95
2008/0137222 A1* 6/2008 Park ................. B29D 11/00634 359/885
2009/0267492 A1* 10/2009 Kwon .................. H01L 51/524 313/504
2011/0198654 A1* 8/2011 Naya .................. H01L 51/5268 257/98
2012/0286258 A1* 11/2012 Naraoka ................ C09K 11/06 257/40
2014/0252330 A1 9/2014 Oh et al.
2014/0252331 A1 9/2014 Oh et al.
2014/0353618 A1 12/2014 Shim et al.
2015/0076468 A1* 3/2015 Yamaguchi ............ G02B 1/118 257/40

FOREIGN PATENT DOCUMENTS

KR 1020110043246 A 4/2011
KR 1020140081653 A 7/2014
KR 1020140110677 A 9/2014
KR 1020140110678 A 9/2014
KR 1020140141391 A 12/2014
WO 2010113737 A1 10/2010

OTHER PUBLICATIONS

"Ergonomics of human-system interaction—Part 303: Requirements for electronic visual displays", ISO 9241-303:2011 (E), 2011, pp. 1-43, The International Organization for Standardization, Switzerland.

* cited by examiner

OPTICAL FILM FOR REDUCING COLOR SHIFT AND ORGANIC LIGHT-EMITTING DISPLAY DEVICE EMPLOYING THE SAME

RELATED APPLICATIONS

This application claims priority to Korean Patent Application No. 10-2013-0122817, filed on Oct. 15, 2013, and all the benefits accruing therefrom under 35 U.S.C. § 119, the content of which in its entirety is herein incorporated by reference.

BACKGROUND

1. Field

The disclosure relates to an optical film for reducing a color shift and an organic light-emitting display device including the optical film.

2. Description of the Related Art

An organic light-emitting device ("OLED") typically includes an anode, an organic light-emitting layer and a cathode. In such an OLED, when a voltage is applied between the anode and the cathode, holes are injected from the anode into the organic light-emitting layer and electrons are injected from the cathode into the organic light-emitting layer. The holes and the electrons that are injected into the organic light-emitting layer recombine with each other in the organic light-emitting layer to generate excitons, and light is emitted when the states of the excitons change from an excited state to a ground state.

In the OLED, a light-emitting material is an organic material, such that the OLED may degrade and thus typically has a short lifespan.

The OLED may have a microcavity structure, which involves resonating light of a specific wavelength to increase the intensity thereof and emitting the light having the increased intensity, to improve the lifespan thereof. That is, the microcavity structure is a structure in which distances between an anode and a cathode are designed to match representative wavelengths of red, green and blue light, and thus only light corresponding to any of the representative wavelengths is resonated and emitted to the outside and the intensity of light corresponding to other wavelengths is relatively weakened. As a result, the intensity of the light beam emitted to the outside may be increased and sharpened, thereby increasing luminance and color purity. The increase in the luminance may allow an OLED to have lower current consumption and a longer lifespan.

SUMMARY

In an organic light-emitting device ("OLED") having a micro cavity structure, wavelengths to be amplified are determined based on the thickness of an organic deposition material layer. Here, length of a light path changes at a lateral side, thereby causing an effect similar to change of thickness of an organic deposition material layer. Therefore, wavelengths to be amplified are changed.

Accordingly, in such an OLED, as the viewing angle is tilted from the front to a side, the maximum resolution wavelength becomes shorter, and thus color shift may occur as the maximum resolution wavelength decreases. In such an OLED, even if white color is embodied at the front, the white color may become bluish at a lateral side due to blue shift phenomenon.

Provided are embodiments of an optical film for reducing a color shift and an organic light-emitting display device including the optical film.

According to an embodiment of the invention, an optical film includes: a high refractive index pattern layer including a material having a refractive index greater than about 1, where a groove pattern defined by a plurality of grooves, each of which has a curved groove surface and a depth greater than a width, is defined on a first surface of the high refractive index pattern, the plurality of grooves are two-dimensionally arranged in a first direction and a second direction, and a cross-sectional shape of each of the plurality of grooves in the first surface is an anisotropic shape in which a length in a first axial direction and a length in a second axial direction, which is perpendicular to the first axial direction, are different from each other; and a low refractive index pattern layer including a material having a refractive index less than the refractive index of the high refractive index pattern layer and further including a plurality of fillers corresponding to the plurality of grooves.

In an embodiment, the cross-sectional shape of each of the plurality of grooves in the first surface may be an elliptical shape.

In an embodiment, each of the plurality of grooves may have a semi-elliptical shape.

In an embodiment, a ratio of the length of the cross-sectional shape of each of the plurality of grooves in the second axial direction to the length of the cross-sectional shape of each of the plurality of grooves in the first axial direction is greater than about 1 and less than about 3.

In an embodiment, the plurality of grooves may be arranged along a plurality of straight lines which extend in the first direction and are spaced apart from one another in the second direction, where grooves respectively arranged on adjacent straight lines are alternately disposed.

In an embodiment, the first axial direction and the second axial direction may respectively correspond to the first direction and the second direction.

In an embodiment, the first axial direction may tilt at a predetermined angle greater than about 0° and less than about 75° with respect to the first direction.

In an embodiment, the first axial direction and the second axial direction may respectively correspond to the first direction and the second direction, and the plurality of grooves may be arranged in a rectangular shape in the first direction and the second direction.

In an embodiment, the plurality of grooves may be arranged in a rectangular shape in the first direction and the second direction, the first direction may tilt at a predetermined angle greater than about 0° and less than about 75° with respect to the first axial direction, and the second direction may tilt at a predetermined angle greater than about 0° and less than about 75° with respect to the second axial direction.

In an embodiment, a ratio of an area occupied by the groove pattern to an area of a boundary surface between the high refractive index pattern layer and the low refractive index pattern layer may be no less than about 35% and no greater than about 45%.

In an embodiment, a shorter one from among the length of the cross-sectional shape of each of the plurality of grooves in the first axial direction and the length of the cross-sectional shape of each of the plurality of grooves in the second axial direction, which is perpendicular to the first axial direction, may be a short-axis length, and a ratio of the depth to the short-axis length of each of the plurality of grooves may be in a range from about 2 to about 2.8.

In an embodiment, the low refractive index pattern layer may further include a flat portion which connects the plurality of fillers.

In an embodiment, the optical film may further include: an anti-reflection film disposed on the second surface of the high refractive index pattern layer; and an adhesive layer disposed on the low refractive index pattern layer.

In an embodiment, the optical film may further include a circular polarization film disposed between the high refractive index pattern layer and the anti-reflection film, and the circular polarization film may include a phase shift layer and a linear polarization layer.

In an embodiment, the optical film may further include a transmittance-adjusting layer disposed between the high refractive index pattern layer and the anti-reflection film.

According to another embodiment of the invention, an organic light-emitting display device includes: an organic light-emitting panel including a plurality of pixels including organic light-emitting layers, where each of the plurality of pixels emits light of different wavelengths and has a microcavity structure which resonates light corresponding to one of the different wavelengths; and an optical film disposed on the organic light-emitting panel, where the optical film includes: a high refractive index pattern layer including a material having a refractive index greater than about 1, where a groove pattern defined by a plurality of grooves, each of which has a curved groove surface and a depth greater than a width, is defined on a first surface of the high refractive index pattern, the plurality of grooves are two-dimensionally arranged in a first direction and a second direction, and a cross-sectional shape of each of the plurality of grooves in the first surface is an anisotropic shape in which a length in a first axial direction and a length in a second axial direction, which is perpendicular to the first axial direction, are different from each other; and a low refractive index pattern layer including a material having a refractive index less than the refractive index of the high refractive index pattern layer and further including a plurality of fillers corresponding to the plurality of grooves.

In an embodiment, the first direction and the second direction may respectively correspond to a horizontal direction and a vertical direction of the organic light-emitting panel.

BRIEF DESCRIPTION OF THE DRAWINGS

These and/or other feature of the invention will become apparent and more readily appreciated from the following description of embodiments of the invention, taken in conjunction with the accompanying drawings, in which.

DETAILED DESCRIPTION

Figure 1:
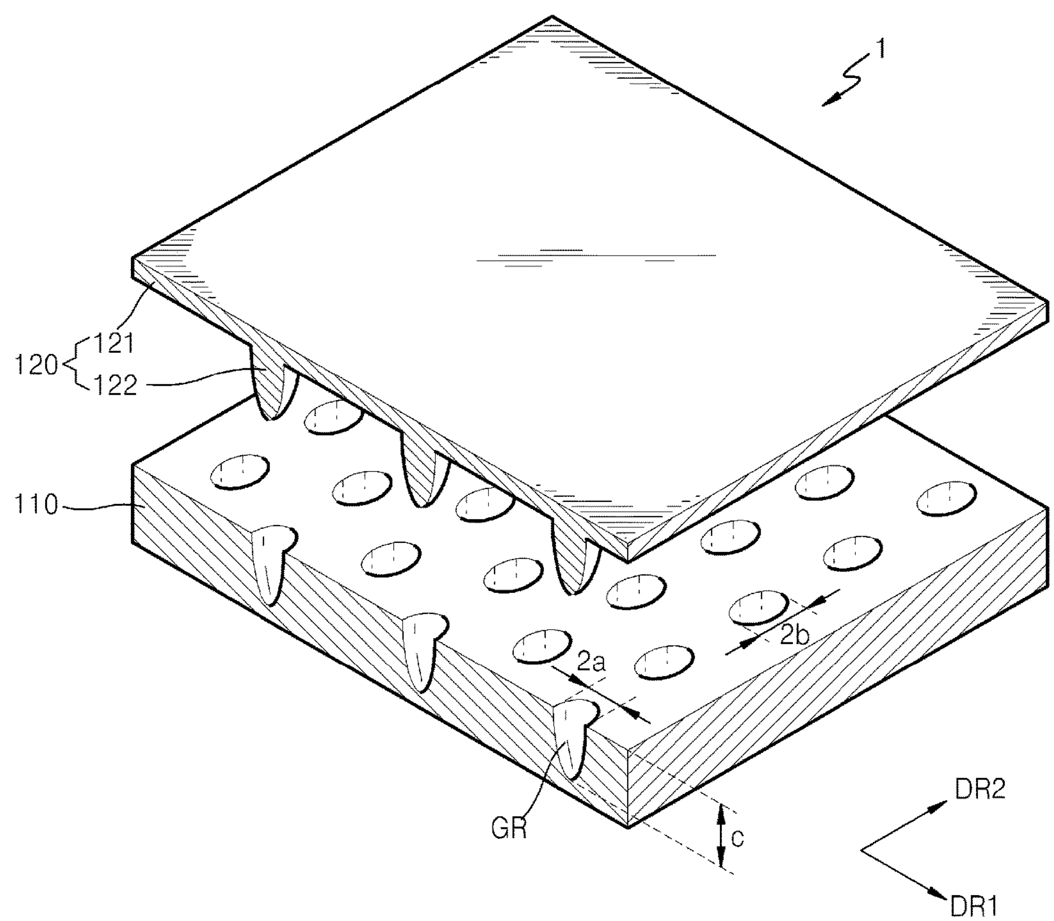
FIG. 1 is an exploded perspective view illustrating a structure of an embodiment of an optical film according to the invention.

The invention will now be described more fully hereinafter with reference to the accompanying drawings, in which various embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

Figure 2:
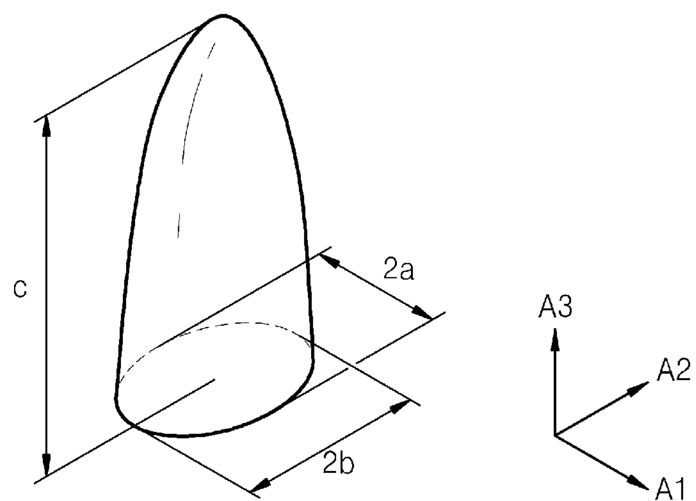
FIG. 2 is a view illustrating a shape of an embodiment of a filler in the optical film of FIG. 1.

FIG. 1 is an exploded perspective view illustrating a structure of an embodiment of an optical film 1 according to the invention. FIG. 2 is a view illustrating a shape of a filler 122 in the optical film 1 of FIG. 1.

In an embodiment, the optical film 1 includes a high refractive index pattern layer 110 including a groove pattern defined by a plurality of grooves GR that are curved and each have a depth greater than a width, and a low refractive index pattern layer 120 including a plurality of the fillers 122 defined by a protruding portion thereof to corresponds to the plurality of grooves GR. In such an embodiment, the plurality of the fillers 122 fills the plurality of grooves GR when the low refractive index pattern layer 120 is dispose on the high refractive index pattern layer 110.

The plurality of grooves GR are two-dimensionally arranged in a first direction DR1 and a second direction DR2. In one embodiment, for example, as shown in FIG. 1, the plurality of grooves GR may be arranged along a plurality of straight lines that extend substantially in the first direction DR1 and are spaced apart from one another in the second direction DR2, and the grooves GR on adjacent straight lines may be alternately disposed, e.g., disposed in a zigzag manner. However, embodiments of the invention are not limited thereto. In one alternative embodiment, for example, the grooves GR may be arranged in a rectangular shape in the first direction DR1 and the second direction DR2. The grooves GR may be arranged uniformly or regularly with predetermined period in the first direction DR1 and the second direction DR2.

In an embodiment, as shown in FIG. 2, a cross-sectional shape of each of the grooves GR may be an anisotropic shape in which a length of the groove GR in a first axial direction A1 and a length of the groove GR in a second axial direction A2 that is perpendicular to the first axial direction A1 are different from each other. In an embodiment, as shown in FIGS. 1 and 2, the cross-sectional shape of each of the grooves GR may be an elliptical shape having a short-axis length 2*a* and a long-axis length 2*b*. In such an embodiment, a ratio of the length in the second axial direction A2 to the first axial direction A1, that is, b/a may be greater than about 1 and less than about 3. Hereinafter, a ratio of the length in the second axial direction A2 to the first axial direction A1, that is, b/a, will be referred to as 'pattern anisotropy ratio'. The length of the groove GR in the first axial direction A1 and the length of the groove GR in the second axial direction A2 in the cross-sectional shape of the groove GR relates to the amount of improvement in a color shift in the first axial direction A1 and the second axial direction A2, which will be described later in greater detail with reference to various computer simulation results.

In an embodiment, the groove GR may have a semi-elliptical shape, e.g., a semi-elliptical ball shape. In such an embodiment, the groove GR may have a shape obtained by halving an ellipse, which has a length 2*a* in the first axial direction A1, a length 2*b* in the second axial direction A2, and a length 2*c* in a third axial direction A3, in a direction perpendicular to the third axial direction A3. Here, c corresponds to a depth of the groove GR, and is determined based on an aspect ratio of the groove GR. The aspect ratio, which is a ratio of the depth c to a width of the groove GR, refers to a ratio of the depth c to the length 2*a* in the first axial direction A1 of the groove GR. The aspect ratio may be in a range from about 2 to about 2.8.

In an embodiment, as shown in FIG. 1, the first axial direction A1 and the second axial direction A2 that define the cross-sectional shape of the groove GR respectively correspond to the first direction DR1 and the second direction DR2 that define an arrangement of the grooves GR. However, embodiments of the invention are not limited thereto. In one alternative embodiment, for example, the first axial direction A1 and the second axial direction A2 may respectively tilt at predetermined angles with respect to the first direction DR1 and the second direction DR2.

An area ratio of the area that is occupied by the groove patterns in the high refractive index pattern layer 110 to an area of a boundary surface between the high refractive index pattern layer 110 and the low refractive index pattern layer 120 may be equal to or greater than about 35% and equal to or less than about 45%. Here, the areas of the groove patterns and the area of the boundary surface may be defined as areas from a top view of the high refractive index pattern layer 110. Hereinafter, the area ratio will be referred to as a 'pattern occupying ratio'. In such an embodiment, the pattern occupying ratio may be determined or controlled to obtain a front transmittance that is equal to or greater than a predetermined front transmittance when a shape or an arrangement type of the groove pattern is determined based on the amount of improvement in a color shift, which will be described later in greater detail with computer simulation results.

In an embodiment, the high refractive index pattern layer 110 may include or be formed of a material having a refractive index equal to or greater than about 1, for example, a transparent plastic material. In an embodiment, the high refractive index pattern layer 110 may include or be formed of a transparent plastic material including a light diffuser or a light absorber. In such an embodiment, the light diffuser may be diffusing beads, and the light absorber may be a black dye such as carbon black. In such an embodiment, the light diffuser planarizes a peak that may occur in a color shift (Au'v') and luminance profile with respect to viewing angle, and thus the light diffuser improves visual characteristics. In such an embodiment, the light absorber increases a contrast ratio or a color purity using a dye therein, which selectively absorbs a specific wavelength or carbon black therein, which may absorb visible light, e.g., light having a wavelength in a visible light wavelength range.

In an embodiment, a surface of the groove GR may be a curved elliptical surface, but embodiments of the invention are not limited thereto. In an alternative embodiment, the surface of the groove GR may be any of various aspheric surfaces, such as a parabolic surface or a hyperbolic surface, for example.

The low refractive index pattern layer 120 may include or be formed of a resin material having a refractive index less than a refractive index of the high refractive index pattern layer 110. The low refractive index pattern layer 120 may include or be formed of a transparent plastic material including a light diffuser or a light absorber. The light diffuser may include a diffusing bead, and the light absorber may include a black dye such as carbon black.

In an embodiment, the low refractive index pattern layer 120 may include the fillers 122 having shapes corresponding to the grooves GR that are defined or formed in the high refractive index pattern layer 110, and may further include a flat portion 121 that connects the plurality of fillers 122. In such an embodiment, shapes of the fillers 122 are complimentary to those of the grooves GR, and the fillers 122 and the grooves GR may be described to have the same shape regarding their respective pattern shapes.

In an embodiment, the optical film 1 mixes light by refracting light that is incident in one direction and emitting light in various directions based on incident positions, which will be described later in greater hereinafter with reference to FIGS. 3 and 4.

Figure 3:
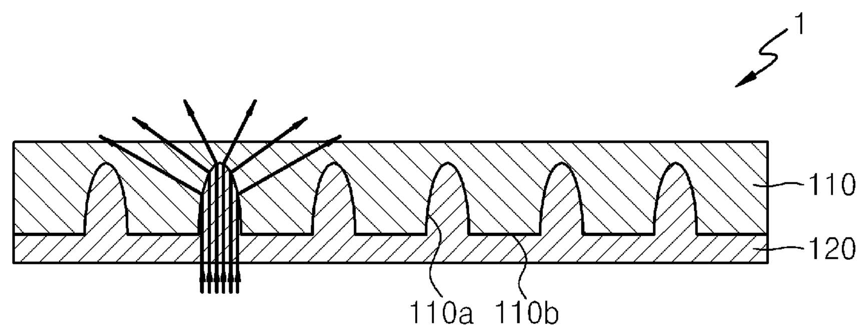
FIG. 3 is a cross-sectional view illustrating an optical path through which light vertically incident on the optical film of FIG. 1 is emitted.

FIG. 3 is a cross-sectional view illustrating an optical path through which light vertically incident on the optical film 1 of FIG. 1 is emitted. FIG. 4 is a cross-sectional view illustrating an optical path through which light obliquely incident on the optical film 1 of FIG. 1 is emitted.

Figure 4:
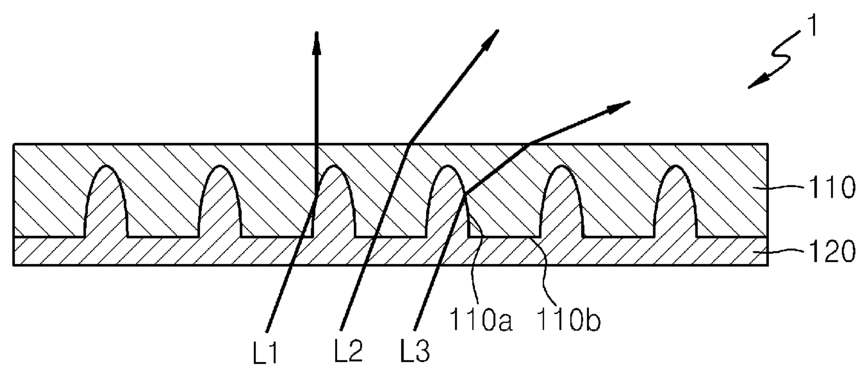
FIG. 4 is a cross-sectional view illustrating an optical path through which light obliquely incident on the optical film of FIG. 1 is emitted.

Referring to FIGS. 3 and 4, in an embodiment, a boundary surface between the high refractive index pattern layer 110 and the low refractive index pattern layer 120 includes a curved surface 110*a* that defines the groove GR and a flat surface 110*b*, and the curved surface 110*a* functions as a lens surface.

Referring to FIG. 3, light vertically incident on the optical film 1 is refracted in directions according to positions at which the light meets the curved surface 110*a* and is then emitted from the optical film 1. That is, light beams incident to the curved surface 110*a* of the optical film 1 with the same incident angle are refracted in various directions according to positions at which the light meets the curved surface 110*a*, thereby the optical film 1 diffuses light.

Referring to FIG. 4, light obliquely incident on the optical film 1 is refracted in various directions according to positions at which the light is incident. In an embodiment, as shown in FIG. 4, light L1 that passes through the flat surface 110*b* and meets the curved surface 110*a* in the high refractive index pattern layer 110 is totally reflected by the curved surface 110*a* and then is emitted from the optical film 1. In such a path, an angle at which the light L1 is emitted from a top surface of the high refractive index pattern layer 110 is less than an angle at which the light L1 is incident on the optical film 1. In such an embodiment, light L2 that passes through the flat surface 110*b* without passing through the curved surface 110*a* is refracted at a boundary between the high refractive index pattern layer 110 and the outside, with a refraction angle that is greater than an incident angle. That is, the light L2 is emitted from the optical film 1 at an angle that is greater than the incident angle at which the light L2 is incident on the optical film 1. In such an embodiment, light L3 that meets the curved surface 110*a* in the low refractive index pattern layer 120 is refracted by the curved surface 110*a* and then is refracted again by the top surface of the high refractive index pattern layer 110, such that the light L3 is emitted from the optical film 1 at a refraction angle that is greater than that of the light L2 that is emitted after passing through the flat surface 110*b* without meeting the curved surface 110*a*. As such, the lights L1, L2 and L3 that are obliquely incident on the optical film 1 at the same angle are emitted from the optical film 1 at different refraction angles according to positions on the optical film 1 at which the lights L1, L2 and L3 are incident.

In an embodiment, as described above, during light beams are passing through the optical film 1, light beams incident on the optical film 1 at various angles are mixed together.

In FIGS. 3 and 4, a specific optical path through which incident light is diffused is exemplary and is also exaggerated for convenience of illustration. For example, refraction of light that may occur at a flat surface 110*b* is not shown.

Also, an optical path may be slightly changed based on a refractive index difference between the high refractive index pattern layer 110 and the low refractive index pattern layer 120, an aspect ratio of each of the grooves GR in the high refractive index pattern layer 110, period with which the grooves GR are repeatedly arranged, a width of each of the grooves GR, and a shape of a curved surface of each of the grooves GR, and thus an extent to which light is mixed and a luminance of emitted light are also changed based on the changes in the optical path.

In an embodiment, when light beams incident on the optical film 1 have different optical characteristics according to their incident angles, the light beams are emitted after the optical characteristics of the light beams are uniformly mixed by the light mixing effect describe above. In one embodiment, for example, when light is emitted from an OLED, a color shift occurs in which color characteristics slightly vary according to an angle at which the light is emitted. However, since light of different color shift are mixed after the light passes through the optical film 1 having the above-described structure, the degree of color shift according to viewing angles is reduced.

In the description above, the cross-sectional views of FIGS. 3 and 4 may correspond to any cross-sectional view perpendicular to a surface defined by the first direction DR1 and the second direction DR2 in FIG. 1. In an embodiment, the optical film 1 may mix light beams, which are incident at various angles on the optical film 1, at any azimuth angle.

Figure 5:
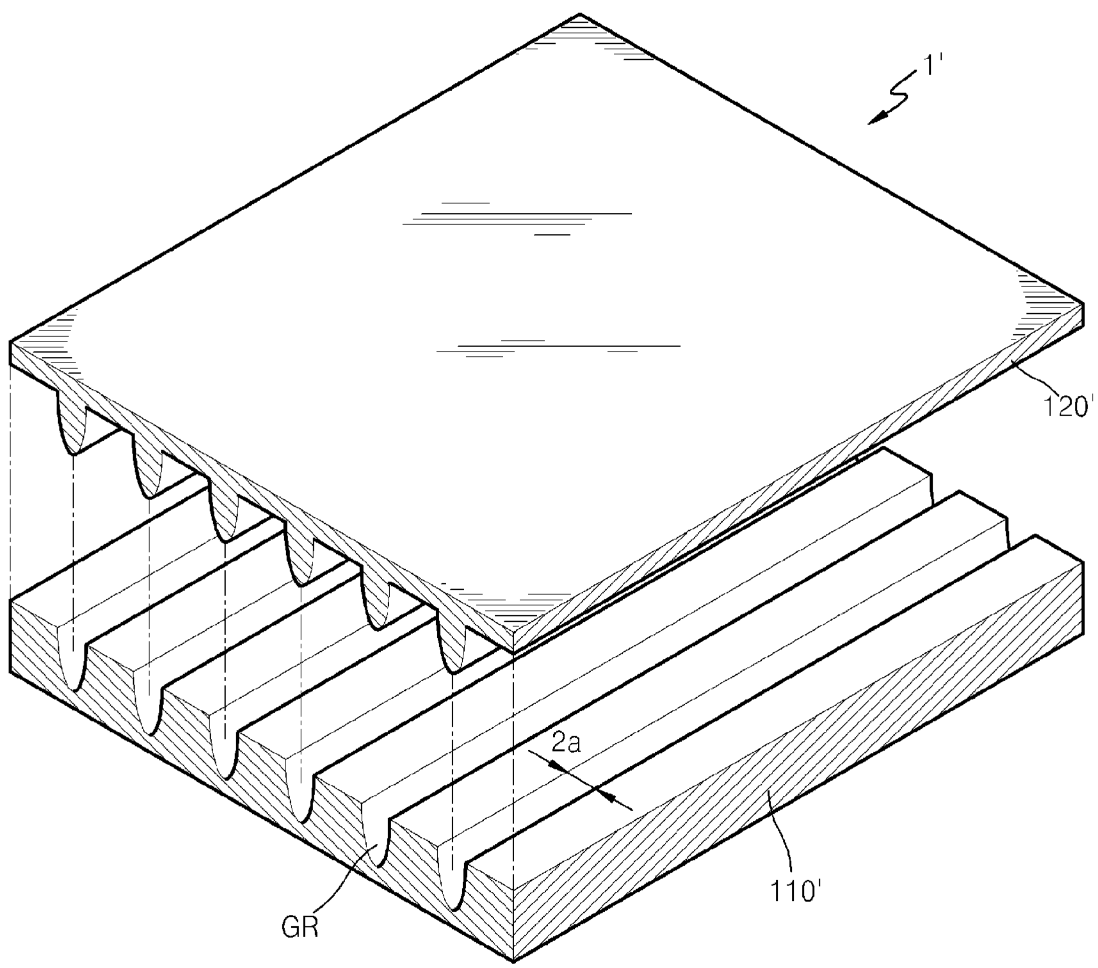
FIG. 5 is an exploded perspective view illustrating a structure of a comparative embodiment of an optical film.

FIG. 5 is an exploded perspective view illustrating a structure of a comparative embodiment of an optical film 1'.

The comparative embodiment of the optical film 1' shown in FIG. 5 includes a high refractive index pattern layer 110' and a low refractive index pattern layer 120', and each of the grooves GR is defined or formed in a stripe shape that extends in one direction. Hereinafter, the comparative embodiments of the optical film will be referred to as a comparative example.

Figure 6:
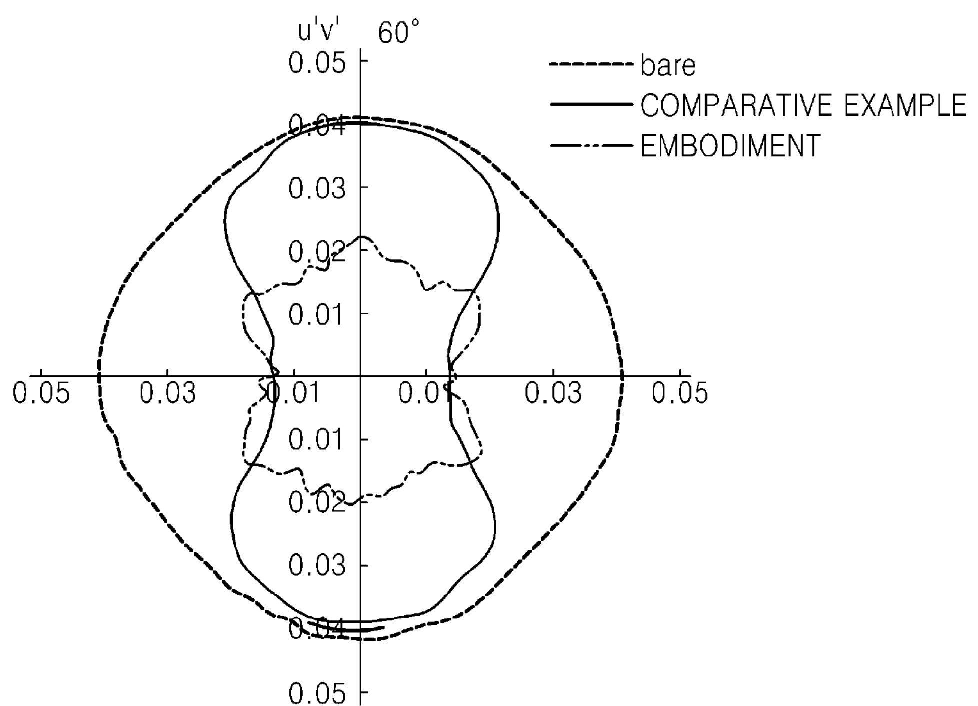
FIG. 6 is a graph illustrating a color shift distribution of light passing through display panels including an embodiment of an optical film according to the invention and the comparative embodiment of the optical film, respectively, and a display panel including no optical film (a bare case)

FIG. 6 is a graph illustrating a color shift distribution of light passing through display panels including an embodiment of an optical film according to the invention and a comparative example, respectively, and a display panel including no optical film (a bare case).

The following graphs show computer simulation results obtained after measuring an organic light-emitting display panel including an OLED having a microcavity structure. A color shift seen at each azimuth angle was calculated under conditions where a viewing angle is 60° and front white (x, y)=(0.28, 0.29).

Referring to the graph of FIG. 6, a color shift in each of a display panel including the comparative example and a display panel including an embodiment of the optical film is less than a color shift in the bare case including no optical film. In the comparative example, a color shift in a horizontal direction is reduced, but a reduction of a color shift becomes decreased as it becomes to a vertical direction, thereby resulting in substantially less improvement in a color shift in the vertical direction. The reduction of a color shift in a vertical direction is reduced because, since a stripe-shaped pattern is provided in the comparative example, a color shift in a direction perpendicular to the stripe-shaped pattern is mainly reduced. In an embodiment according to the invention, as described with reference to FIGS. 3 and 4, since a color mixing effect occurs at various azimuth angles, a color shift in an overall azimuth angle range is improved. Although the amount of improvement in a color shift in a vertical direction is slightly less than the amount of improvement in a color shift in a horizontal direction, the improvement in a color shift in a vertical direction is substantially great when a color shift at a lateral side with respect to a front is less than about 0.02, since such a difference may not be easily perceived by a user's eyes in general.

Figure 7:
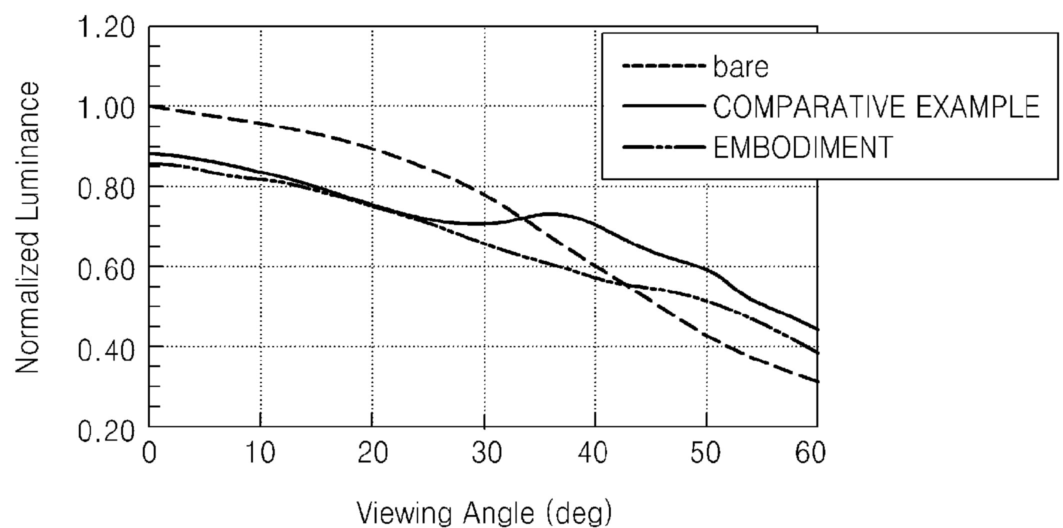
FIG. 7 is a graph illustrating luminance versus viewing angle of a display panel including an embodiment of an optical film according to the invention, a display panel including the comparative embodiment of an optical film, and a display panel including no optical film (a bare case)

FIG. 7 is a graph illustrating a relationship between a luminance and a viewing angle of a display panel including an embodiment of an optical film according to the invention, a display panel including an optical film according to a comparative example, and a display panel including no optical film (a bare case).

Referring to the graph of FIG. 7, luminance reversal that occurs in the comparative example does not occur in an embodiment according to the invention. The term "luminance reversal" used herein refers to a phenomenon where, as a viewing angle increases, a luminance instantly increases based on a specific angle (instead of gradually decreasing) and then decreases.

Figure 8:
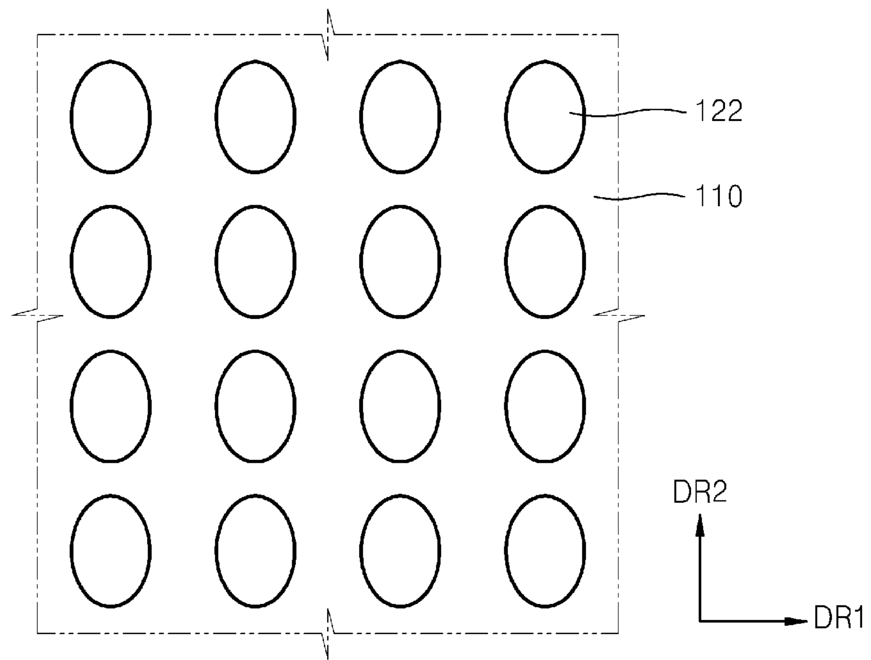
FIGS. 8 through 10 are plan views illustrating groove patterns in embodiments of the optical film of FIG. 1.
Figure 9:
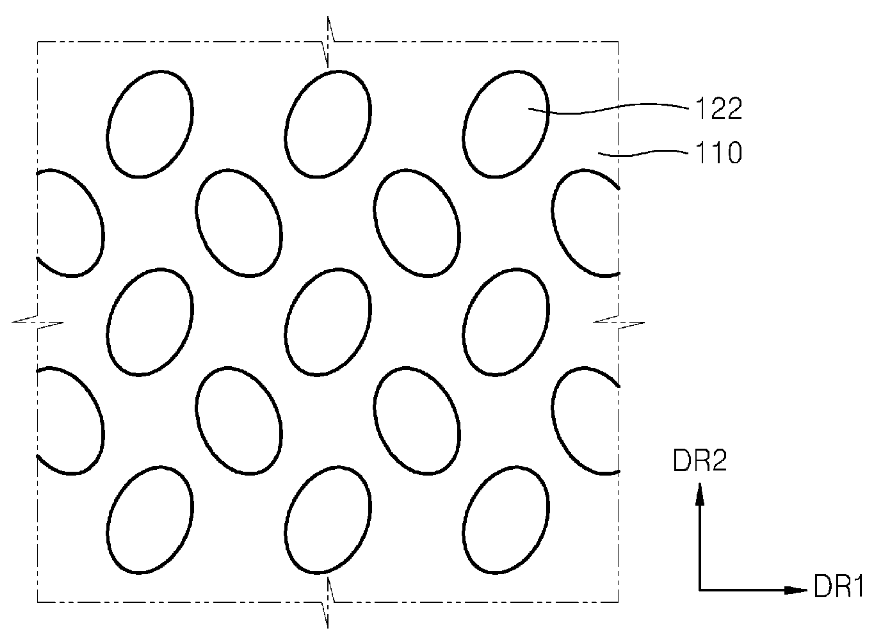
Figure 10:
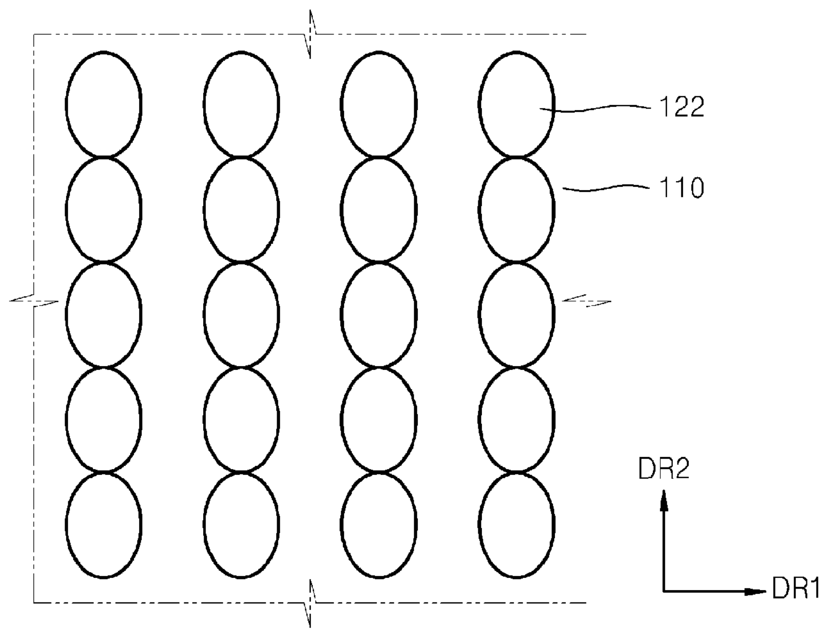

FIGS. 8 through 10 are plan views illustrating embodiments of the groove pattern in the optical film 1 of FIG. 1 at a boundary surface between the high refractive index pattern layer 110 and the low refractive index pattern layer 120, according to the invention.

Referring to FIG. 8, in an embodiment, the fillers 122 may be arranged in a rectangular shape in the first direction DR1 and the second direction DR2, e.g., linearly disposed along the first direction DR1 and the second direction DR2. In such an embodiment, the fillers 122 are disposed in a predetermined positions such that the first axial direction A1 and the second axial direction A2 defined in FIG. 2 respectively correspond to the first direction DR1 and the second direction DR2.

Referring to FIG. 9, in an alternative embodiment, the fillers 122 are alternately arranged as shown in FIG. 1, and in a cross-sectional shape of each of the fillers 122, the first axial direction A1 and the second axial direction A2 respectively tilt at predetermined angles with respect to the first direction DR1 and the second direction DR2. Although tilt angles of the fillers 122 on adjacent straight lines are the inverse, for example, θ and −θ, the embodiments of the invention are not limited thereto. In such an embodiment, each of the tilt angles may be greater than about 0° and less than about 75°. The tilt angles may be determined or controlled to improve a color shift at a specific azimuth angle.

Referring to FIG. 10, in another alternative embodiment, the fillers 122 are continuously arranged without gaps in the second direction DR2, and in a cross-sectional shape of each of the fillers 122, the first axial direction A1 and the second axial direction A2 respectively correspond to the first direction DR1 and the second direction DR2. In the structure of FIG. 10, the fillers 122 may be effectively or efficiently manufactured by providing or forming nodes in a stripe shape such as that shown in FIG. 4.

Figure 11:
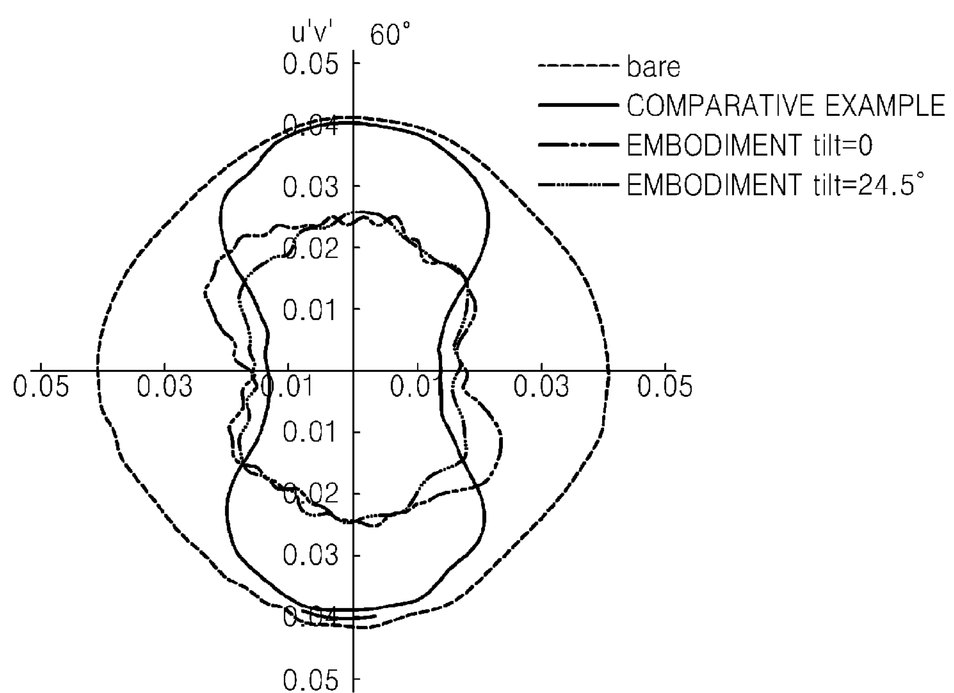
FIG. 11 is a graph illustrating a color shift distribution of light passing through a display panel including an embodiment of an optical film according to the invention, a display panel including a comparative embodiment of an optical film, and a display panel including no optical film (a bare case), respectively, with respect to a tilt angle of a pattern axis.

FIG. 11 is a graph illustrating a color shift distribution of light passing through a display panel including an embodiment of an optical film according to the invention, a display panel including the comparative example, and a display panel including no optical film (a bare case), when a tilt angle is changed.

Referring to the graph of FIG. 11, a color shift distribution of light passing through a display panel according to tilt angles within a predetermined azimuth angle range is illustrated, where a color shift distribution when a tilt angle is about 24.5° has a different shape than that of a color shift distribution when a tilt angle is about 0°. Accordingly, in an embodiment of the invention, the amount of improvement in a color shift may be adjusted to be a specific azimuth angle by adjusting a tilt angle.

Figure 12A:
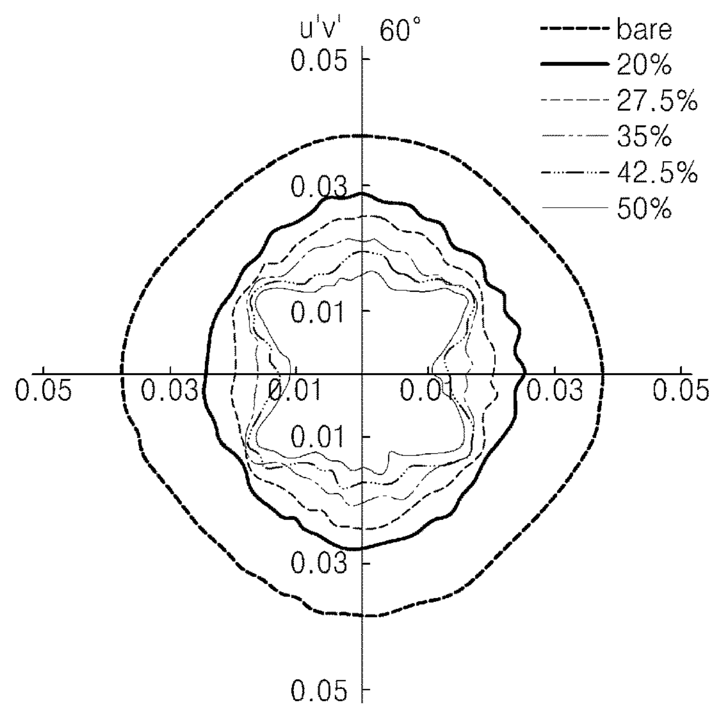
FIGS. 12A through 12C are graphs illustrating a color shift with respect to pattern occupying ratios in embodiments of an optical film, where a pattern anisotropy ratio is about 1.2, about 1.6 and about 2, respectively.
Figure 12B:
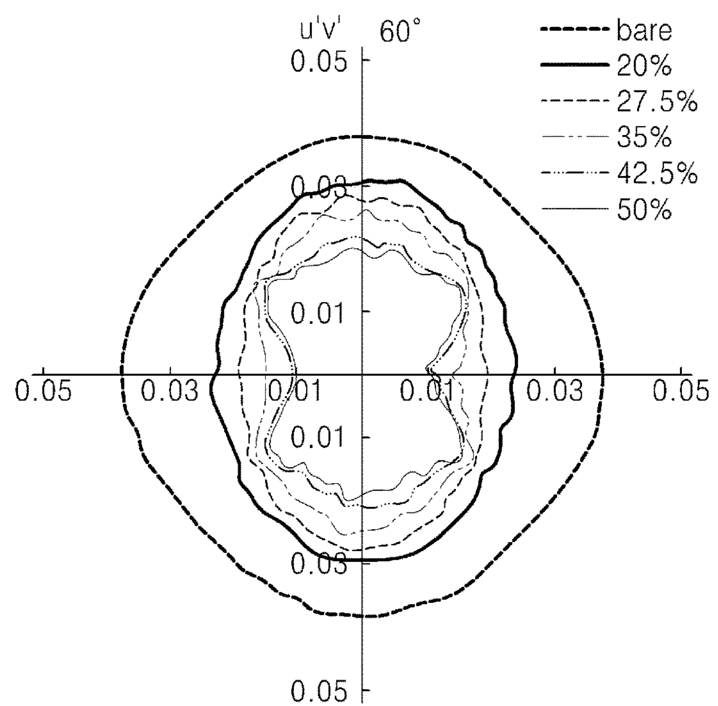
Figure 12C:
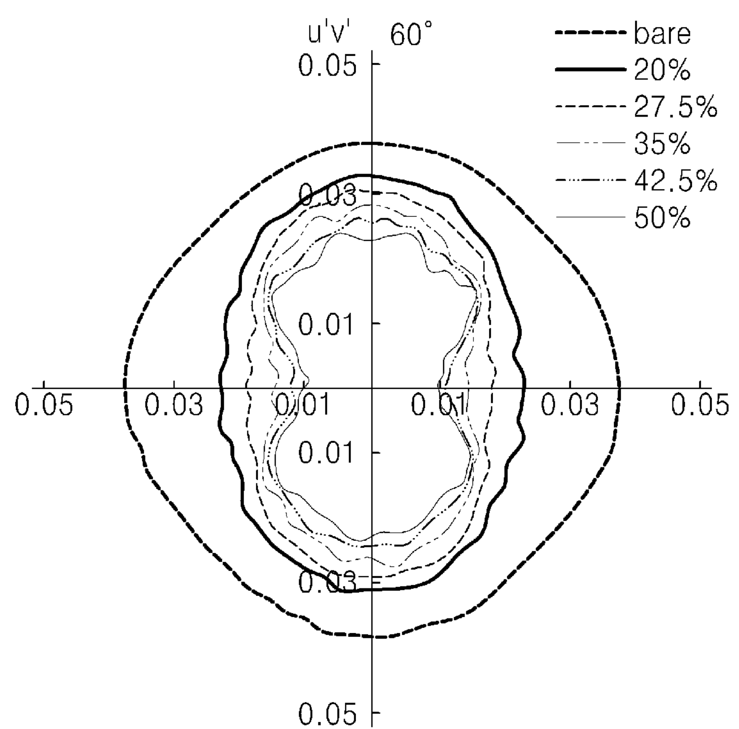

FIGS. 12A through 12C are graphs illustrating a color shift with respect to various pattern occupying ratios, e.g., a pattern anisotropy ratio of about 1.2, about 1.6, and about 2, respectively, in an embodiment according to the invention. As is defined in the above description regarding FIG. 1, a pattern occupying ratio indicates a ratio of the area that is occupied by the groove patterns to an area of a boundary surface between the high refractive index pattern layer 110 and the low refractive index pattern layer 120. A pattern anisotropy ratio indicates a ratio of a length of a pattern in the second axial direction A2 to a length of the pattern in the first axial direction A1.

Referring to the graphs of FIGS. 12A to 12C, in an embodiment, as a pattern occupying ratio increases, the amount of improvement in a color shift may increase, and as the pattern anisotropy ratio increases, the amount of improvement in a color shift in a horizontal direction may be similar or not be substantially changed, while the amount of improvement in a color shift in a vertical direction decreases.

Figure 13A:
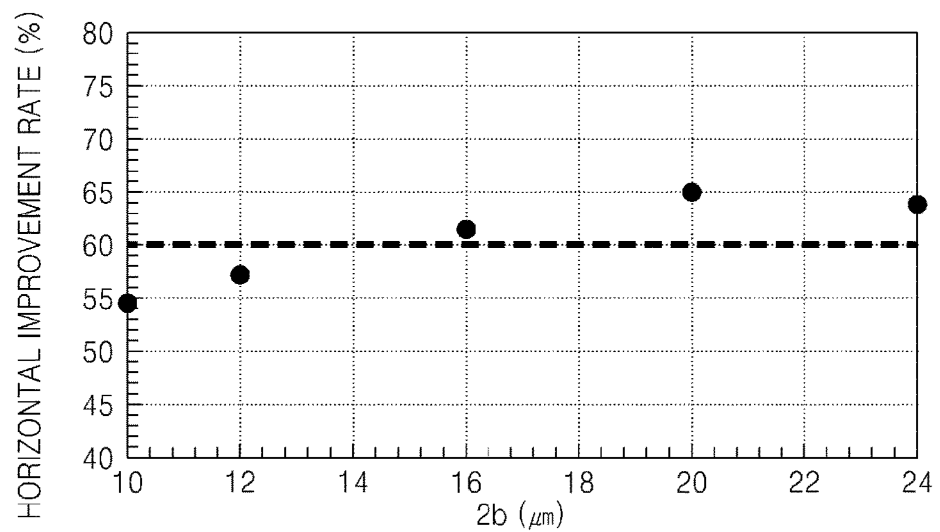
FIGS. 13A and 13B are graphs illustrating a horizontal color improvement rate and a vertical color improvement rate versus length of a groove pattern in a second axial direction in an embodiment of an optical film.
Figure 13B:
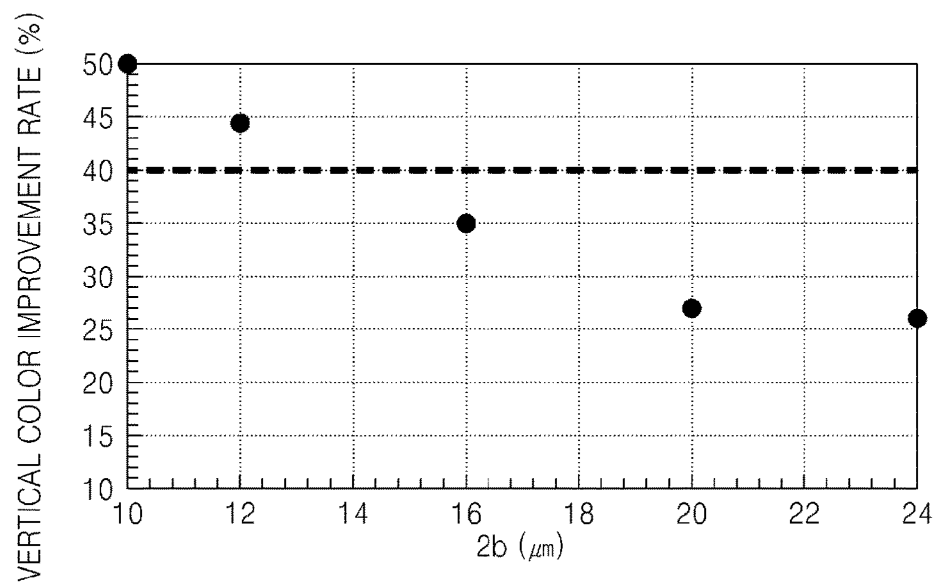

FIGS. 13A and 13B are graphs illustrating a horizontal color improvement rate and a vertical color improvement rate, respectively, versus the length 2*b* in the second axial direction A2 of a groove pattern in an embodiment of an optical film.

The graphs were obtained when the length 2*a* in the first axial direction A1 was fixed to about 10 micrometers (μm). Referring to the graphs of FIGS. 13A and 13B, as the length 2*b* increases, a horizontal color improvement increases and a vertical color improvement rate decreases. That is, as the length 2*b* in the second axial direction A2 increases, a color shift in a horizontal direction that is perpendicular to the second axial direction A2 decreases and a color shift in a vertical direction that is parallel to the second axial direction A2 increases. The length 2*b* may be set in consideration of a horizontal color improvement rate and a vertical color improvement rate. In a display panel, a color shift requirement in a horizontal direction (i.e., a horizontal color improvement rate) is generally less than a color shift requirement in a vertical direction (i.e., a vertical color improvement rate). Accordingly, in one embodiment, for example, the length 2*b* in the second axial direction A2 may be determined to be, for example, greater than about 10 μm and less than about 15 μm to satisfy both a horizontal color improvement rate of about 60% or greater and a vertical color improvement rate of about 40% or greater.

Figure 14A:
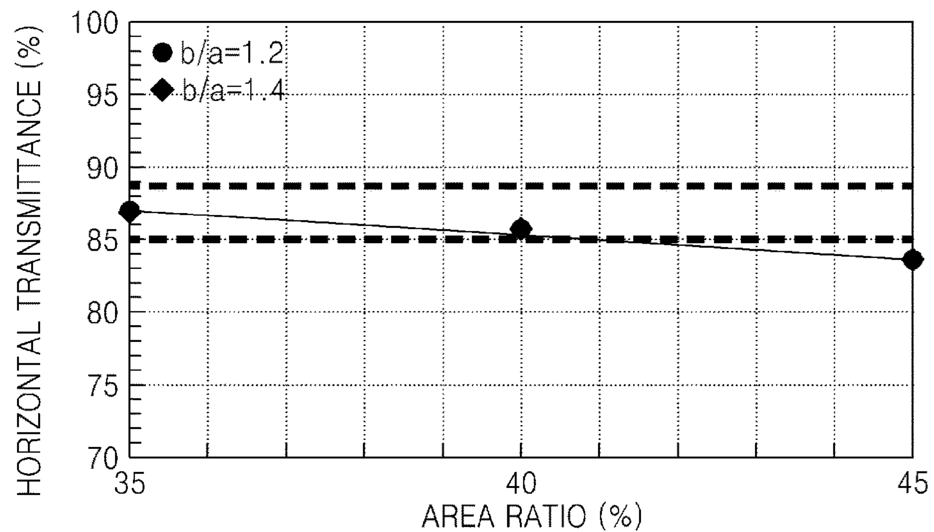
FIGS. 14A through 14C are graphs respectively illustrating a front transmittance, a horizontal color improvement rate and a vertical color improvement rate with respect to a pattern occupying ratio in embodiments of an optical film, where pattern anisotropy ratio is about 1.2 and about 1.4, respectively.
Figure 14B:
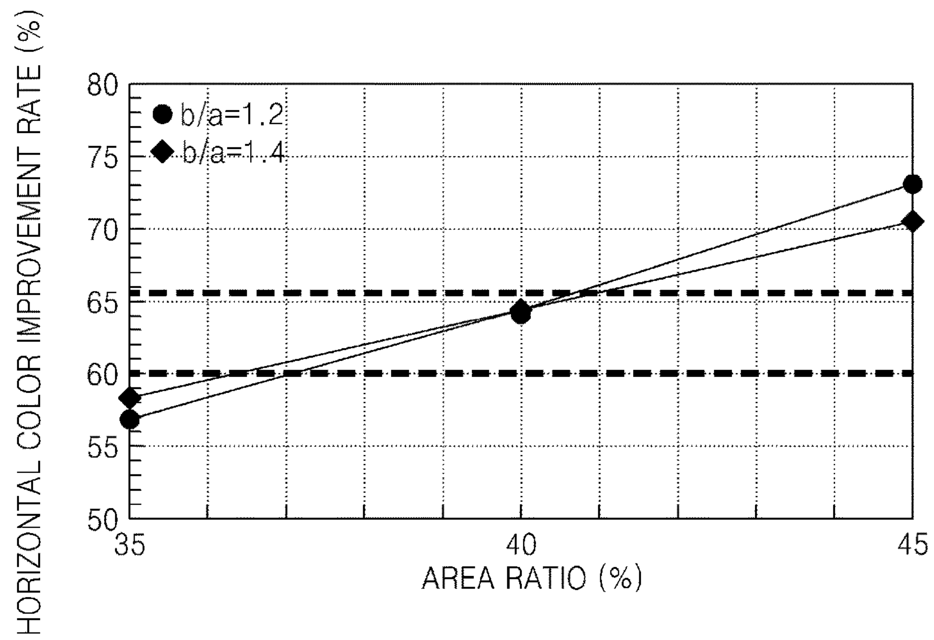
Figure 14C:
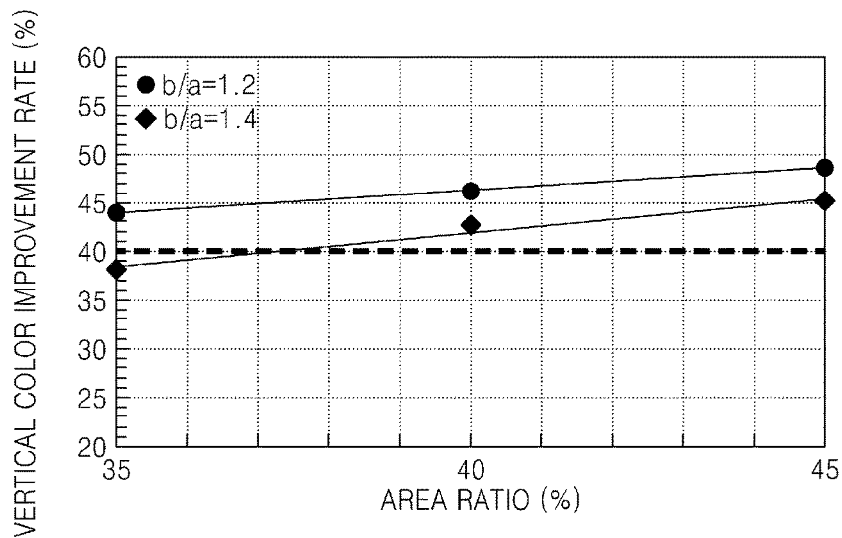

FIGS. 14A through 14C are graphs respectively illustrating a front transmittance, a horizontal color improvement rate and a vertical color improvement rate, with respect to a pattern occupying ratio in embodiments of an optical film, where a pattern anisotropy ratio is about 1.2 and about 1.4.

In an embodiment, as shown in FIGS. 14A to 14C, as a pattern occupying ratio increases, both a horizontal color improvement rate and a vertical color improvement rate increase, and a front transmittance decreases. Accordingly, in an embodiment, the pattern occupying ratio may be set based on such relations between a front transmittance, a horizontal color improvement rate and a vertical color improvement rate. The pattern occupying ratio may be set to be equal to or greater than about 35% and equal to or less than about 45%, to have a front transmittance of 85% or more.

Figure 15:
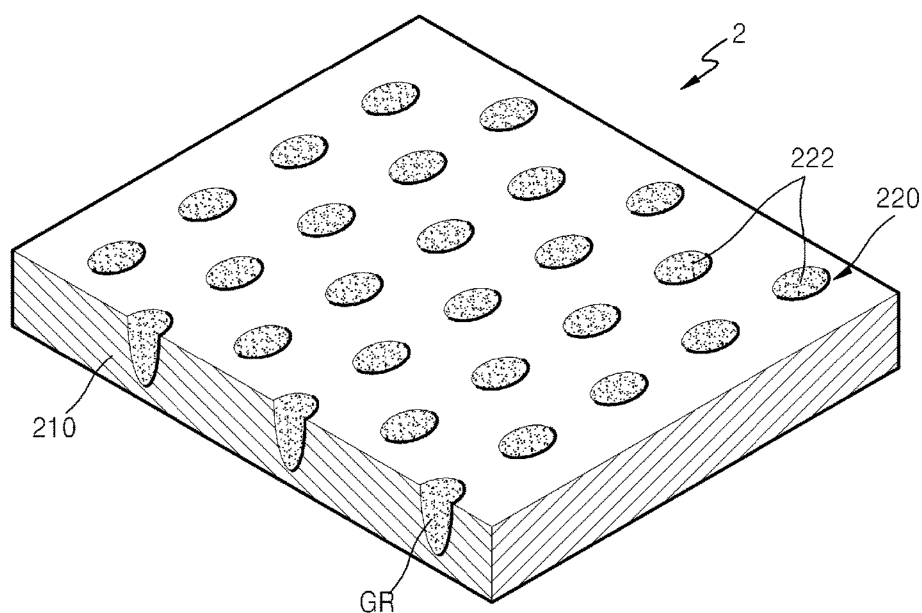
FIG. 15 is a perspective view illustrating a structure of an alternative embodiment of an optical film according to the invention.

FIG. 15 is a perspective view illustrating a structure of an alternative embodiment of an optical film 2 according to the invention.

An embodiment of the optical film 2 includes a high refractive index pattern layer 210 having a groove pattern defined by the plurality of grooves GR having a curved grooved surface, and a low refractive index pattern layer 220 including a plurality of fillers 222 that fills the plurality of grooves GR. In such an embodiment, the low refractive index pattern layer 220 may not include a flat portion that connects the fillers 222 as shown in FIG. 1. An arrangement and a shape of the fillers 222 are not limited to those in FIG. 15 and may be variously modified, e.g., as described above with reference to FIGS. 8 and 9.

An embodiment of the optical film 1 or 2 may further include an adhesive layer, a circular polarization film, or a transmittance-adjusting layer when the optical film 1 or 2 is applied to an organic light-emitting display device, which will now be described in detail.

Figure 16:
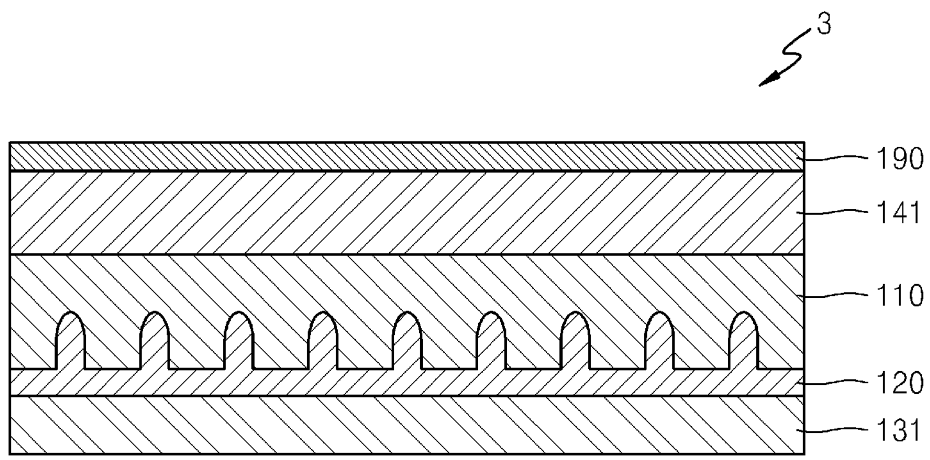
FIG. 16 is a cross-sectional view illustrating a structure of another alternative embodiment of an optical film according to the invention.

FIG. 16 is a cross-sectional view illustrating a structure of an alternative embodiment of an optical film 3 according to the invention.

In an embodiment, the optical film 3 may further include an anti-reflection film 190 disposed over the high refractive index pattern layer 110, and a first adhesive layer 131 disposed under the low refractive index pattern layer 120. In such an embodiment, the optical film 3 may further include a first base film 141 disposed between the high refractive index pattern layer 110 and the anti-reflection film 190.

In such an embodiment, the first adhesive layer 131 may be adhered to an organic light-emitting panel and may be a pressure sensitive adhesive ("PSA") layer including a light absorber or a light diffuser. In such an embodiment, the high refractive index pattern layer 110 and/or the low refractive index pattern layer 120 may include or be formed of a transparent material including a light absorber. In such an embodiment, a material including a light absorber may be applied to various layers constituting an optical film, such that a reflectance of external light may be reduced, thereby improving visibility.

The first base film 141 may function as a substrate used for providing or forming the high refractive index pattern layer 110 and the low refractive index pattern layer 120 in a manufacturing process of the optical film 3, and the first base film 141 may include or be formed of an optically isotropic material, for example, triacetyl cellulose ("TAC").

Figure 17:
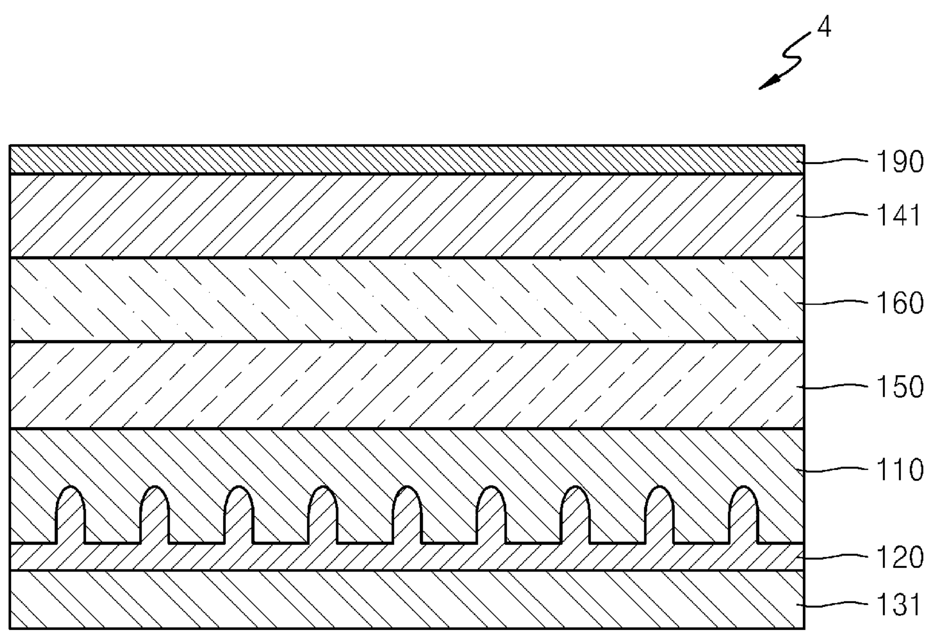
FIGS. 17 and 18 are cross-sectional views illustrating alternative embodiments of an optical film, each including a circular polarization film, according to the invention.
Figure 18:
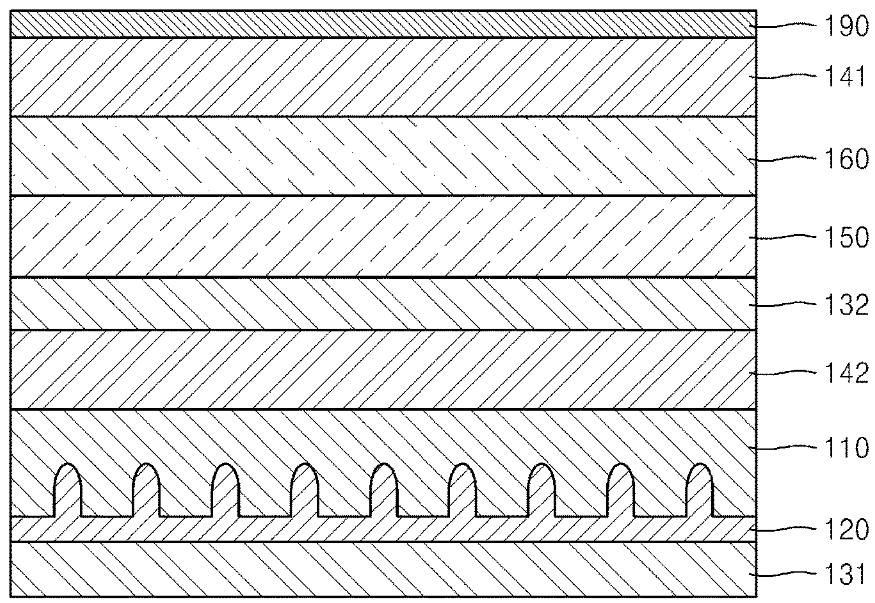

FIGS. 17 and 18 are cross-sectional views illustrating embodiments of an optical film 4 and 5, each including a circular polarization film, according to the invention.

In such an embodiment, the circular polarization film may include a phase shift layer 150 and a linear polarization layer 160. The phase shift layer 150 may be, for example, a λ/4 phase difference film. The linear polarization film 160 may include a polyvinyl alcohol ("PVA") film or may have a TAO film-stacked structure or any of various other structures of a conventional linear polarization film. The PVA film functions to polarize light and may be provided or formed by adsorbing a dichroic pigment onto PVA, which is a polymer.

Referring to FIGS. 17 and 18, an embodiment of the optical film 4 or 5 may include the adhesive layer 131, the low refractive index pattern layer 120, the high refractive index pattern layer 110, the phase shift layer 150, the linear polarization layer 160, the first base film 141 and the anti-reflection film 190 that are sequentially disposed from a bottom, that is, sequentially stacked one on another.

The circular polarization film including the phase shift layer 150 and the linear polarization layer 160 functions to reduce a reflectance of external light and improve visibility. When external light that is non-polarized is incident, the external light is changed to linearly polarized light by passing through the linear polarization layer 160 and is changed to circularly polarized light by passing through the phase shift layer 150. The circularly polarized light when passed through the phase shift layer 150 further passes through an interfacial surface between the phase shift layer 150 and the high refractive index pattern layer 110, the high refractive index pattern layer 110, the low refractive index pattern layer 120 and the first adhesive layer 131, and then is reflected by an interfacial surface between an organic light-emitting panel (not shown) and the first adhesive layer 131, and thereby circularly polarization direction thereof is changed oppositely or inversed. Then, the circularly polarized light having opposite direction is changed by the phase shift layer 150 to linearly polarized light that is perpendicular to a transmission axis of the linear polarization layer 160, and the linearly polarized light is not emitted to the outside.

In an embodiment, as shown in FIG. 17, where the circular polarization film is disposed on the high refractive index pattern layer 110, if the high refractive index pattern layer 110 includes or is formed of an anisotropic material having an optical axis different from that of the circular polarization film, polarization may not be effectively maintained, such that incident external light may be emitted to the outside, and a reflectance may be substantially increased. Thus, visibility may be reduced. Accordingly, in an embodiment, the high refractive index pattern layer 110 may include or be formed of an isotropic material having an optical axis that is substantially the same as that of the circular polarization film, such as TAO or solvent-cast polycarbonate In an embodiment, as shown in FIG. 18, the optical film 5 may further include a second base film 142 and a second adhesive layer 132, which are disposed between the high refractive index pattern layer 110 and the phase shift layer 150 to be sequentially disposed from the high refractive index pattern layer 110 toward the phase shift layer 150.

Figure 19:
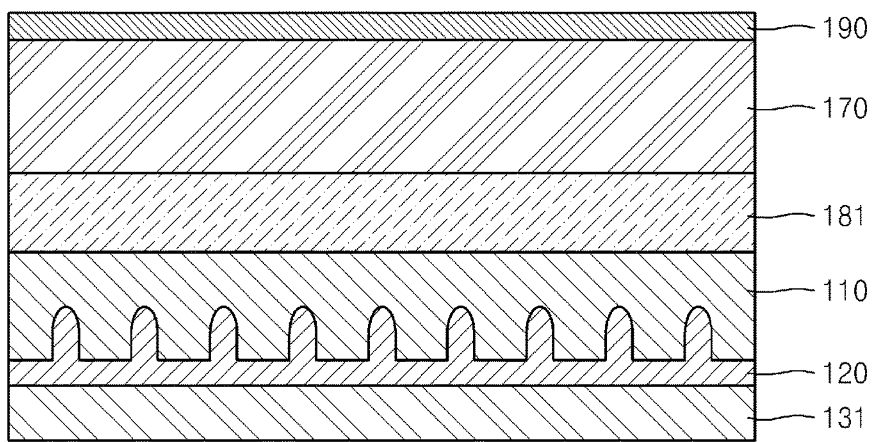
FIG. 19 is a cross-sectional view illustrating a structure of an embodiment of an optical film including a transmittance-adjusting layer, according to the invention.

FIG. 19 is a cross-sectional view illustrating a structure of an embodiment of an optical film 6 including a transmittance-adjusting layer 170, according to the invention.

The transmittance-adjusting layer 170 may be a film that is formed by dispersing in a polymer resin a black material for absorbing light such as a black dye, a pigment, carbon black, or cross-linked particles on which a black dye, a pigment, or carbon black is coated. In one embodiment, for example, the polymer resin may include, but are not limited to, a binder such as polymethyl methacrylate ("PMMA") and an ultraviolet ("UV")-curable resin such as an acryl-based resin. In such an embodiment, a proportion of the black material contained in the polymer resin or a thickness of the transmittance-adjusting layer 170 may be determined based on optical properties of the black material. A transmittance of the transmittance-adjusting layer 170 may be equal to or greater than about 40%, which is slightly higher than a transmittance of the circular polarization film. Although the circular polarization film may completely block external light, a low transmittance of the circular polarization film may be caused. In an embodiment, the transmittance-adjusting layer 170 is used to compensate the low transmittance of the circular polarization film.

In an embodiment, the optical film 6 may include the first adhesive layer 131, the low refractive index pattern layer 120, the high refractive index pattern layer 110, a first carrier film 181, the transmittance-adjusting layer 170 and the anti-reflection film 190, which are sequentially disposed from the bottom.

The first carrier film 181 is used as a substrate for providing or forming the high refractive index pattern layer 110 and the low refractive index pattern layer 120, or as a substrate for providing or forming the anti-reflection film 190 or the transmittance-adjusting layer 170, during a manufacturing process of the optical film 6. In an embodiment, where the optical film 6 does not include a linear polarization layer and does not need to maintain polarization, as shown in FIG. 18, the optical film 6 may include any of various materials including TAO, polyethylene terephthalate ("PET"), and PC.

Although the high refractive index pattern layer 110 and the low refractive index pattern layer 120 in each of the embodiments of the optical film 3 through 6 shown in FIGS. 16 through 19 have a same shape as in the embodiment illustrated in FIG. 1, the shape is merely exemplary, and the shape may be variously modified, e.g., shapes described above with reference to FIGS. 8, 9, 10 and 15 or a combination thereof. Also, an arrangement in each of the embodiments of the optical film 3 through 6 of FIGS. 16 through 19 may be variously modified as described above. In one embodiment, for example, positions of the phase shift layer 150 and the linear polarization layer 160 constituting the circular polarization film may be changed, or another layer may be disposed between the phase shift layer 150 and the linear polarization layer 160. In such an embodiment, a second substrate or a second carrier film may be added.

In embodiments of the optical film described herein may refract and emit light that is vertically incident and obliquely incident to various directions including a front direction and a side direction. In such embodiments, the optical film may mix incident light incident at various angles in an overall azimuth angle range as well as in a horizontal direction by two-dimensionally arranging an anisotropic pattern that has a long-axis length and a short-axis length that are different from each other.

Such embodiments of the optical films may be applied to an organic light-emitting display device. The organic light-emitting display device may include an organic light-emitting layer that has a microcavity structure that increases color purity of the emitted light. In such an organic light-emitting display device, a color shift according to a viewing angle may be reduced at any azimuth angle, thereby displaying a high-quality image.

Figure 20:
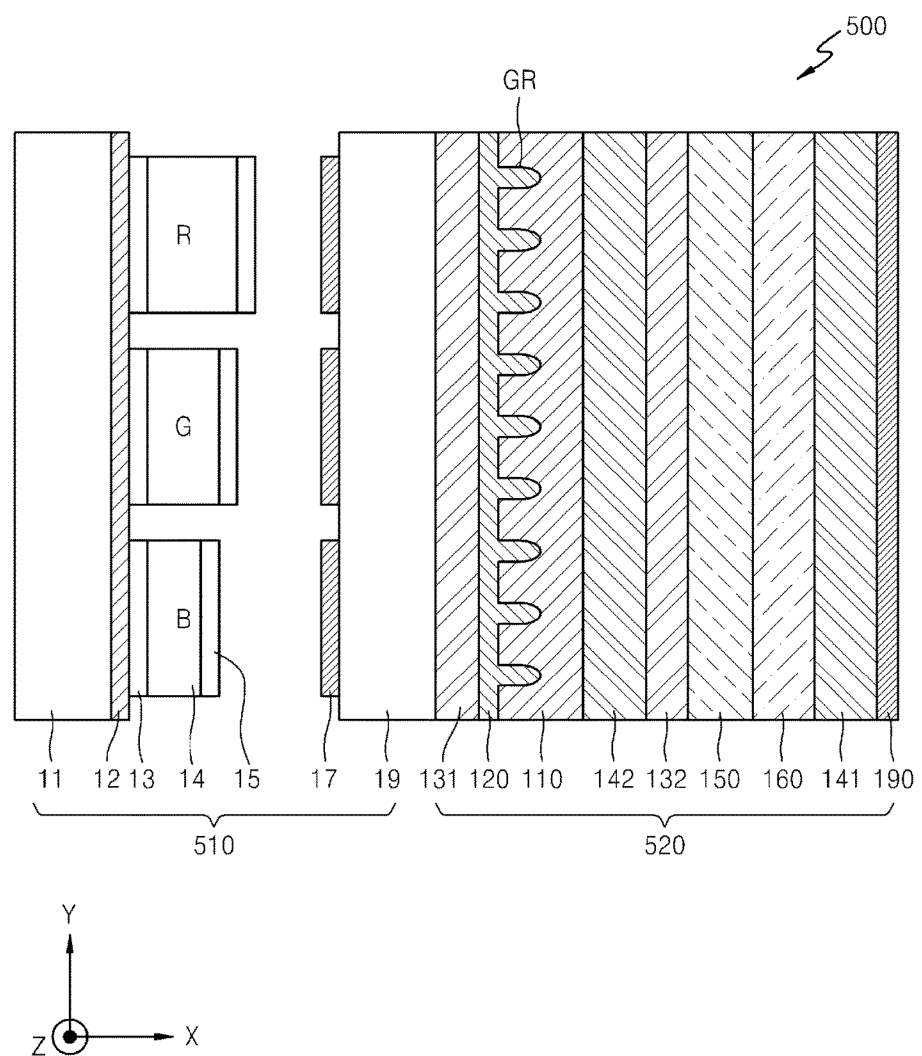
FIG. 20 is a cross-sectional view illustrating a structure of an embodiment of an organic light-emitting display device according to the invention.

FIG. 20 is a cross-sectional view illustrating a structure of an embodiment of an organic light-emitting display device 500 according to the invention.

In an embodiment, the organic light-emitting display device 500 includes an organic light-emitting panel 510 that includes a plurality of pixels, and an optical film 520 that is disposed on the organic light-emitting panel 510. In such an embodiment, the pixels include organic light-emitting layers, and each of the pixels emits light of different wavelengths from each other and has a microcavity structure that resonates light of corresponding wavelength.

As shown in FIG. 20, the optical film 520 of such an embodiment of the organic light-emitting display device 500 may be an embodiment of the optical film 5 described above with reference to FIG. 18, embodiments of the invention are not limited thereto, and such an embodiment of the organic light-emitting display device 500 may include any of the embodiments of the optical film 1, 2, 3, 4 or 6 described above.

In an embodiment, the organic light-emitting panel 510 has a microcavity structure configured to increase a luminance and color purity of emitted light. In such an embodiment, the organic light-emitting panel 500 includes a plurality of OLEDs that emit any of red (R), green (G), blue (B) and white light, and each OLED includes an anode 13, an organic light-emitting layer 14 and a cathode 15. In an embodiment, as shown in FIG. 20, when the organic light-emitting panel 510 includes OLEDs having unit pixels configured to emit red, green and blue light, a microcavity structure is configured to allow a distance between the anode 14 and the cathode 16 of the OLED that emits red light of a long wavelength to be the longest, and a distance between the anode 14 and the cathode 16 of the OLED that emits blue light of a short wavelength to be the shortest. In such an embodiment, the organic light-emitting panel 510 may be formed based on a predetermined structure in which a distance between the anode 13 and the cathode 15 of unit pixels configured to emit red, green and blue light matches a representative wavelength of red, green and blue light, and thus the unit pixels configured to emit red, green and blue light resonate and emit only corresponding light to the outside while weakening other pieces of light.

A structure of the organic light-emitting panel 510 will now be described in greater detail.

Each sub-pixel of the organic light-emitting panel 510 may include a corresponding OLED that is disposed between a first substrate 11 and a second substrate 19 that face each other and includes the anode 13, the organic light-emitting layer 14 and the cathode 15, and a driving circuit unit 12 that is disposed on the first substrate 11 and is electrically connected to the anode 13 and the cathode 15.

The anode 13 may include or be formed of an opaque metal such as aluminum (Al), and the cathode 15 may be a transparent electrode including or formed of, for example, indium tin oxide ("ITO"), or a semi-transparent electrode including or formed of, for example, a nickel (Ni), so that light emitted from the organic light-emitting layer 14 may be easily transmitted through the cathode 15.

In an embodiment, the driving circuit unit 12 may include at least two thin-film transistors ("TFT"s, not shown) and capacitors (not shown), and controls the brightness of the OLED by controlling the amount of current supplied to the OLED based on a data signal.

The driving circuit unit 12 may be a circuit for driving a unit pixel of the organic light-emitting panel 510, and may include a gate line, a data line that perpendicularly intersects the gate line, a switching TFT that is connected to the gate line and the data line, a driving TFT that is connected to the OLED and is disposed between the switching TFT and a power line, and a storage capacitor that is connected between a gate electrode of the driving TFT and the power line.

In such an embodiment, the switching TFT applies a data signal of the data line to a gate electrode of the driving TFT and the storage capacitor in response to a scan signal of the gate line. The driving TFT controls the brightness of the OLED by adjusting current supplied to the OLED from the power line in response to the data signal from the switching TFT. In such an embodiment, the storage capacitor stores a data signal from the switching TFT as a stored voltage and applies the stored voltage to the driving TFT, and thus the driving TFT enables constant current to be supplied even when the switching TFT is turned off.

In an embodiment, the organic light-emitting layer 15 includes a hole injection layer ("HIL"), a hole transport layer ("HTL"), a light-emitting layer, an electron transport layer ("ETL") and an electron injection layer ("EIL"), which are sequentially stacked on the anode 13. In such an embodiment, when a forward voltage is applied between the anode 13 and the cathode 15, electrons move from the cathode 15 through the EIL and the ETL into the light-emitting layer, and holes move from the anode 13 through the HIL and the HTL into the light-emitting layer. When the electrons and the holes injected into the light-emitting layer recombine in the light-emitting layer, excitons are generated, and light is emitted when the state of the excitons change from an excited state to a ground state. In such an embodiment, the brightness of the emitted light is proportional to the amount of current that flows between the anode 13 and the cathode 15.

In an embodiment, the organic light-emitting panel 510 includes a color filter 17 to improve color efficiency. In such an embodiment, the color filter 17 is disposed on the second substrate 19, a red color filter is disposed in a red sub-pixel region, a green color filter is disposed in a green sub-pixel region, and a blue color filter is disposed in a blue sub-pixel region. In an embodiment, where the unit pixel includes 4 colors (e.g., red, green, blue and white), the color filter 17 may be omitted in a white sub-pixel region.

In an embodiment, although not shown in FIG. 20, a black matrix for effectively preventing light leakage and color mixture may be disposed at a boundary of each sub-pixel of the second substrate 19.

In an embodiment of the organic light-emitting display device 500 having a microcavity structure, a color shift occurs toward a short wavelength because as a viewing angle tilts from a front to a lateral side, maximum resonant wavelength moves to short wavelength. In such an embodiment, although white light is observed at the front, a color shift in which the white light transitions to a blue color may occur at the lateral side, and thus the white light becomes bluish.

In an embodiment, the organic light-emitting display device 500 includes the optical film 520 that is disposed on the organic light-emitting display panel 510 in order to reduce such a color shift.

The grooves GR of the optical film 520 may be two-dimensionally arranged in a first direction and a second direction as described above with reference to FIG. 1, and the optical film 520 may be disposed on the organic light-emitting panel 510 such that the first direction and the second direction may correspond to a horizontal direction Y and a vertical direction Z of the organic light-emitting panel 510.

As described above with reference to FIGS. 3 and 4, the high refractive index pattern layer 110 and the low refractive index pattern layer 120 function together as a color shift-reducing layer, which enables light that is incident at a constant angle to be emitted at various angles. The light emitted from the organic light-emitting display panel 510 has a predetermined angle distribution at which light is emitted and has a color shift according to the angle. After passing through the color shift-reducing layer including the high refractive index pattern layer 110 and the low refractive index pattern layer 120, light that is incident on the color shift-reducing layer at an angle that causes a large color shift and light that is incident on the color shift-reducing layer at an angle that causes a small color shift are uniformly mixed and then emitted, thereby reducing a color shift according to a viewer's viewing angle. Also, since the optical film 520 is disposed such that a pattern having a cross-sectional shape in which a length in a first axial direction and a length in a second axial direction are different from each other is two-dimensionally arranged, a color shift according to a viewing angle may be reduced substantially in any azimuth angle range as well as in a horizontal direction.

In an embodiment, where the optical film 520 is disposed to reduce a color shift according to a viewing angle, image distortion may occur due to the optical film 520. In such an embodiment, a distance between the organic light-emitting layer 14 and the optical film 520 may be set to be equal to or less than about 1.5 millimeters (mm) to minimize such image distortion.

While one or more embodiments of the invention have been described with reference to the figures, it will be understood by those of ordinary skill in the art that various changes in form and details may be made therein without departing from the spirit and scope of the invention as defined by the following claims. Accordingly, the true technical scope of the invention is defined by the technical spirit of the appended claims.

What is claimed is:

1. An optical film comprising:

a high refractive index pattern layer including a first surface and a second surface facing each other, wherein the first surface includes a pattern having a plurality of grooves and a flat surface between the plurality of grooves, the plurality of grooves is repeatedly arranged along a first direction and repeatedly arranged along a second direction perpendicular to the first direction, and a cross-sectional shape of each of the plurality of grooves, when viewed from a plan view parallel to the flat surface, has an anisotropic shape, in which a length in a first axial direction and a length in a second axial direction, which is perpendicular to the first axial direction, are different from each other, the first axial direction and the second axial direction being parallel to the flat surface; and a low refractive index pattern layer comprising a plurality of fillers corresponding to the plurality of grooves and a flat portion which connects the plurality of fillers, the plurality of fillers and the flat portion comprising a material having a refractive index less than the refractive index of the high refractive index pattern layer, each of the plurality of fillers having an aspheric surface, wherein light incident through the low refractive index pattern layer including the plurality of fillers corresponding to the plurality of grooves is emitted through the second surface of the high refractive index pattern layer including the pattern having the plurality of grooves, so that color shift of the light according to viewing angle is reduced.

2. The optical film of claim 1, wherein the cross-sectional shape of each of the plurality of grooves in the first surface is an elliptical shape.

3. The optical film of claim 2, wherein each of the plurality of grooves has a semi-elliptical shape.

4. The optical film of claim 1, wherein a ratio of the length of the cross-sectional shape of each of the plurality of grooves in the second axial direction to the length of the cross-sectional shape of each of the plurality of grooves in the first axial direction is greater than about 1 and less than about 3.

5. The optical film of claim 1, wherein the plurality of grooves is arranged along a plurality of straight lines, which extend in the first direction, and are spaced apart from one another in the second direction, and grooves respectively arranged on adjacent straight lines are alternately disposed.

6. The optical film of claim 5, wherein the first axial direction and the second axial direction respectively correspond to the first direction and the second direction.

7. The optical film of claim 5, wherein the first axial direction tilts at a predetermined angle greater than about 0° and less than about 75° with respect to the first direction.

8. The optical film of claim 1, wherein the first axial direction and the second axial direction respectively correspond to the first direction and the second direction, and the plurality of grooves is arranged in a rectangular shape in the first direction and the second direction.

9. The optical film of claim 1, wherein the plurality of grooves is arranged in a rectangular shape in the first direction and the second direction, the first direction tilts at a predetermined angle greater than about 0° and less than about 75° with respect to the first axial direction, and the second direction tilts at a predetermined angle greater than about 0° and less than about 75° with respect to the second axial direction.

10. The optical film of claim 1, wherein the first axial direction and the second axial direction respectively correspond to the first direction and the second direction, and the plurality of grooves is spaced apart from one another in the first direction, and arranged without gaps in the second direction.

11. The optical film of claim 1, wherein a ratio of an area occupied by the groove pattern to an area of a boundary surface between the high refractive index pattern layer and the low refractive index pattern layer is no less than about 35% and no greater than about 45%.

12. The optical film of claim 1, wherein a shorter one from between the length of the cross-sectional shape of each of the plurality of grooves in the first axial direction and the length of the cross-sectional shape of each of the plurality of grooves in the second axial direction, which is perpendicular to the first axial direction, is a short-axis length, and a ratio of a depth of each of the plurality of grooves to the short-axis length of each of the plurality of grooves is in a range from about 2 to about 2.8.

13. The optical film of claim 1, further comprising:

an anti-reflection film disposed on a second surface of the high refractive index pattern layer, which is opposite to the first surface; and an adhesive layer disposed on the low refractive index pattern layer.

14. The optical film of claim 13, further comprising:

a circular polarization film disposed between the high refractive index pattern layer and the anti-reflection film, wherein the circular polarization film comprises a phase shift layer and a linear polarization layer.

15. The optical film of claim 13, further comprising:

a transmittance-adjusting layer disposed between the high refractive index pattern layer and the anti-reflection film.

16. An organic light-emitting display device comprising:

an organic light-emitting panel comprising a plurality of pixels comprising organic light-emitting layers, wherein each of the plurality of pixels emits light of different wavelengths and has a microcavity structure which resonates light corresponding to one of the different wavelengths; and the optical film of claim 1, disposed on the organic light-emitting panel.

17. The organic light-emitting display device of claim 16, wherein the first direction and the second direction respectively correspond to a horizontal direction and a vertical direction of the organic light-emitting panel.

18. The organic light-emitting display device of claim 17, wherein a ratio of an area occupied by the groove pattern to an area of a boundary surface between the high refractive index pattern layer and the low refractive index pattern layer is no less than about 35% and no greater than about 45%.

19. The organic light-emitting display device of claim 16, further comprising:

an adhesive layer disposed between the organic light-emitting panel and the low refractive index pattern layer; and an anti-reflection film disposed on the high refractive index pattern layer.

* * * * *